United States Patent [19]
Bard et al.

[11] Patent Number: 4,968,390
[45] Date of Patent: Nov. 6, 1990

[54] HIGH RESOLUTION DEPOSITION AND ETCHING IN POLYMER FILMS

[75] Inventors: Allen J. Bard; Oskar E. Huesser, both of Austin, Tex.; Derek H. Craston, Crowborough, Great Britain

[73] Assignee: Board of Regents, The University of Texas System, Austin, Tex.

[21] Appl. No.: 266,592

[22] Filed: Nov. 3, 1988

[51] Int. Cl.$^5$ ............................................. C25D 5/02
[52] U.S. Cl. ...................................... 204/15; 204/130
[58] Field of Search ................................. 204/15, 130

[56] References Cited
PUBLICATIONS

Baratoff et al., "1986 Nobel Prizes Development of Scanning Tunneling Microscopy".
Smith, "A Review of Submicron Lithography, Superlattices and Microstructures", vol. 2, No. 2, 1986, 129–142.
Fuller, "Optical Lithography Status", Solid State Technology, Sep. 1987, 113–118.
Oberal, "Lithography—Challenges of the Future", Solid State Technology, Sep. 1987, 123–128.
Stover, "Frontiers of Optical Lithography", Solid State Technology, Jan. 1987, 53.
Craston, et al., "High Resolution Deposition of Silver in Nafion Films with the Scanning Tunneling Microscope", J. Electrochem. Soc, Accelerated Brief Communication, Mar. 1988, 785–786.
Binnig et al., "Scanning Tunneling Microscopy," Helvetica Physica Acta, vol. 55 (1982) 726–735.
Binnig et al., "7×7 Reconstruction on Si(111) Resolved in Real Space," Physical Review Letters, vol. 50, No. 2 (1983), 120–122.
Ringger et al., "Nanometer Lithography with the Scanning Tunneling Microscope," Appl. Phys. Lett., vol. 46, No. 9 (1985), 832–834.
McCord et al., "Exposure of Calcium Fluoride Resist with the Scanning Tunneling Microscope," J. Vac. Sci. Technol. B, vol. 5, No. 1 (1987), 430–433.
Silver et al., "Direct Writing of Submicron Metallic Features with a Scanning Tunneling Microscope," Appl. Phys. Lett., vol. 51, No. 4 (1987), 247–249.
McCord et al., "Scanning Tunneling Microscope as a Micromechnical Tool," Appl. Phys. Lett., vol. 50, No. 10 (1987), 569–570.
Staufer et al., "Nanometer Scale Structure Fabrication with the Scanning Tunneling Microscope," Appl. Phys. Lett., vol. 51, No. 4, (1987) 244–246.
Lin et al., "High Resolution Photoelectrochemical Etching of n-Gas with the Scanning Electrochemical and Tunneling Microscope," vol. 134, No. 4, 1038–1039.
Liu et al., "Scanning Electrochemical and Tunneling Ultramicroelectrode Microscope for High-Resolution Examination of Electrode Surfaces in Solution," J. Am. Chem. Soc., 1986, vol. 108, No. 13 (1986), 3838–3839.

*Primary Examiner*—T. M. Tufariello
*Attorney, Agent, or Firm*—Arnold, White & Durkee

[57] ABSTRACT

Embodiments of the present invention provide a new method for producing microfine conducting features by utilizing a scanning electrochemical microscope (SECM) (a modified version of the scanning tunneling microscope) to electrochemically deposit various conducting substances on the surfaces of conductive objects. The method comprises the steps of coating or forming a polymeric or ionically conducting film layer over a conductive object upon which the conducting features are to be deposited, placing the tip of an SECM in contact with the conducting film, applying a voltage between the SECM tip and the object so that a current passes through the film from the SECM tip to the object to induce an electrochemical reaction that will cause the desired product to be deposited, and moving the tip across the surface of the film to leave a pattern of microfine deposit features. At the same time, the counter-reaction at the conductive object yields to a localized etching of the lattice with a high resolution.

18 Claims, 10 Drawing Sheets

HIGH RESOLUTION DEPOSITION AND ETCHING IN POLYMER FILMS

BACKGROUND OF THE INVENTION

Since its introduction, the scanning tunneling microscope (STM) (1,2) has been used mainly to determine surface topography and structure at the atomic level. However, there have also been several reports of its use in vacuum or air for surface modification and submicron lithography (3–8). A recent paper from this laboratory (9) described a similar technique, based on the scanning electrochemical microscope (SECM) (10), for the high resolution etching of semiconductors immersed in a liquid. The present invention involves new uses of a modified STM both to deposit extremely fine patterns of metals, semiconductors or polymers in polymer films and to etch the conducting substrate with very high resolution.

SUMMARY OF THE INVENTION

Embodiments of the present invention provide a new method for producing microfine conducting features by utilizing a scanning electrochemical microscope (SECM) (a modified version of the scanning tunneling microscope) to electrochemically deposit various conducting substances on the surfaces of conductive objects. The method comprises the steps of coating or forming a polymeric or ionically conducting film layer over a conductive object upon which the conducting features are to be deposited, placing the tip of an SECM in contact with the conducting film, applying a voltage between the SECM tip and the object so that a current passes through the film from the SECM tip to the object to induce an electrochemical reaction that will cause the desired product to be deposited, and moving the tip across the surface of the film to leave a pattern of microfine deposit features At the same time, the counter-reaction at the conductive object yields to a localized etching of the latter (of the conductive object) with a high resolution.

DESCRIPTION OF THE PREFERRED EMBODIMENT

The present invention involves a new method of depositing and etching metals, semiconductors, and polymers with high resolution ($\cong 1$ $\mu$m) by electrochemical reactions in cast polymer films by employing very fine tips as electrodes and scanning tunneling microscopy (STM) methodology. The basic concept involves casting or forming on a suitable conductive substrate a polymeric or ionically conducting film that contains the reactant(s) that will deposit the desired product(s) upon electrochemical oxidation or reduction. For example, a film of ionically conducting polymer Nafion (11) (thickness, 10 nm to 5 $\mu$m) can be cast on a silver substrate by spin coating, and silver ions can be incorporated into the film The conductive substrate is used as one electrode, and a very fine tip from an SEC.M that scans over the surface of the film acts as the other electrode. Both the deposition and etching processes result as a consequence of passing a current through the conducting film Metal deposition occurs in the film at the tip electrode and localized etching is observed on the conducting substrate. The electrical polarity of the electrodes is chosen for the desired reaction For the Nafion example, the silver substrate is positive and the scanning tip is negative. The scanning tip is brought near (tunneling distance) or into slight contact with the conducting film, and the desired reaction (in the example, silver metal deposition) takes place at the tip. A pattern of the electrodeposited products is formed in the conducting film by moving the tip across the surface in the desired directions. The electrodeposition can be carried out with the film in air or other gas, in vacuum, or under liquid. More details and typical preliminary results are described herein.

The process of the present invention might be used to process or repair integrated circuits, to produce masks (e.g., for X-ray or electron beam photolithography), or to fabricate microsensors or other devices. Present technology relies primarily on photolithographic processes in which resolution is limited by the wave length of radiation employed. With current technology, producing features significantly smaller than 1 $\mu$m is difficult. The proposed technology is limited mainly by tip size and electrochemical considerations. The use of a polymer or ionically conducting film allows control of the chemistry and mass transport rates of reactants. Furthermore, this novel technique, i.e., the use of a substrate coated with an ionically conducting polymer film, has advantages over immersing the substrate in liquid electrolyte These include:

(1) In both systems the resolution of the structures produced is affected by the magnitude of the gap between the tip and substrate electrodes. In electrolyte solutions the faradaic current is not very sensitive to fluctuations in this distance. This makes it impossible to control accurately the inter-electrode spacing. Using the polymer film technique, the tip electrode is placed and maintained at the air/polymer interface. The contact area, and therefore the penetration depth of the tip in the polymer film, depends on the reference current set by the SECM feedback loop. Hence, the tip/substrate electrode distance is always constant with uniform films Therefore, the technique described here produces more uniform structures.

(2) In the liquid electrolyte systems, the resolution of the structures is determined largely by the exposed area of the tip, but the tip electrodes for the liquid electrolyte systems are very difficult to fabricate with areas in the $\mu m^2$ to $nm^2$ range. In contrast, the tip electrodes for the studies described here are very easy to fabricate since the area of the tip in contact with the polymer film is the critical limitation. (see (1) above).

(3) In the liquid electrolyte system, deposits tend to form on the tip electrode, resulting in a large increase in the size of this electrode, with rapid deterioration in resolution (see (1) above). The deposition processes that occur at the tip/polymer interface remain within the film and no change in the tip structure is observed.

Future improvements in tip fabrication technology will reduce the size of the electrode tips employed in this process, thereby improving resolution capability even further.

Figure 1A:
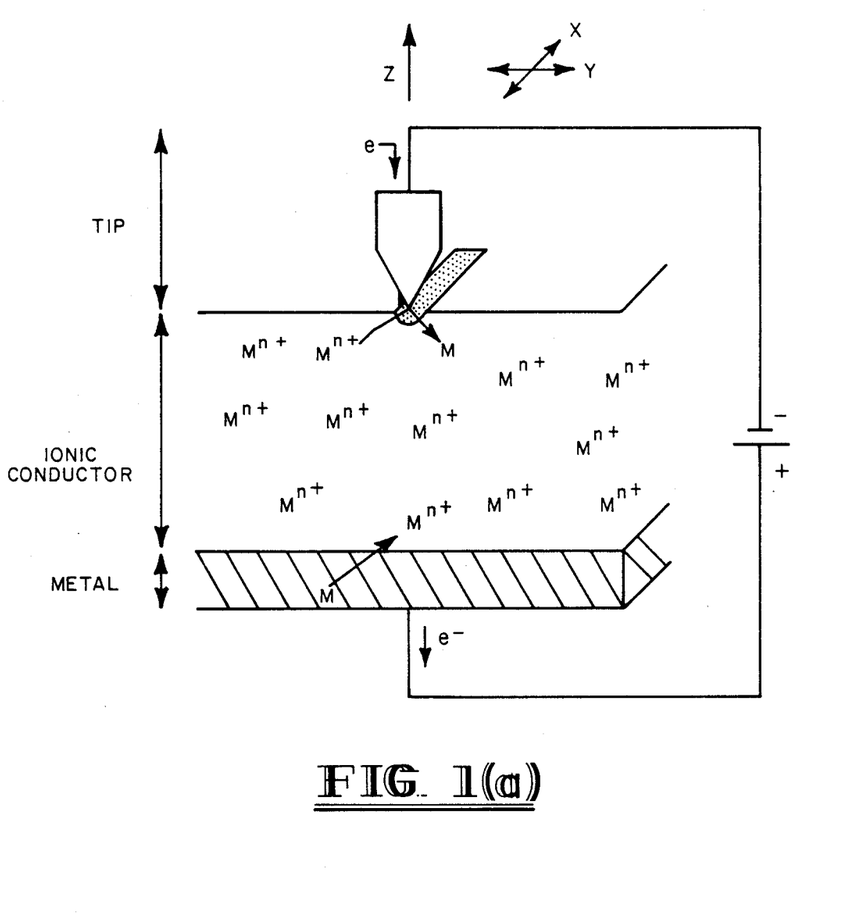
FIG. 1(a) shows a schematic representation of a method to simultaneously deposit species M in an ionic conductor and etch the substrate.

The principle behind this technique is shown in FIG. 1(a). A thin (e.g., ca. $\mu m$) film of an ionic conductor containing the metal ion of interest is formed on a conductive substrate. This is placed in the usual STM-type apparatus (in air), in which the sample can be moved in the X-Y direction and the fine metal tip can be moved in the Z-direction with nm-level resolution. In an alternative arrangement, the tip carries out all of the movements in X-Y and Z directions while the sample is held fixed. A bias voltage is applied between the tip electrode (negative) and the substrate. When point contact is made between the tip and the surface of the ionic conductor, a faradaic current passes, to reduce the metal ions to metal at the tip-ionic conductor interface and oxidize the substrate directly beneath the tip. This stands in contrast to scanning tunneling microscopy, where normally a tunneling current flows instead of a much larger faradaic current. In the present invention, the SECM tip follows the surface of the ionic conductor by means of conventional STM feedback control, which maintains a constant current between the tip and the substrate. It is thus possible to produce metal deposits patterns of uniform width by scanning the tip along the surface of the substrate. If it is assumed that the bias voltage is sufficiently large that the kinetics of the electrode reactions are not rate limiting, then the current obtained when the tip makes contact with the surface of the ionic conductor will depend on the rate of mass transport of metal ions to the tip. Therefore, by setting a low value for the reference current, it should be possible to maintain a contact area on the order of a few $nm^2$, provided that both the diffusion coefficient and the concentration of the metal ions within the ionic conductor are not too low. Hence, very high resolution of deposition and etching can be obtained by this technique.

Figure 1B:
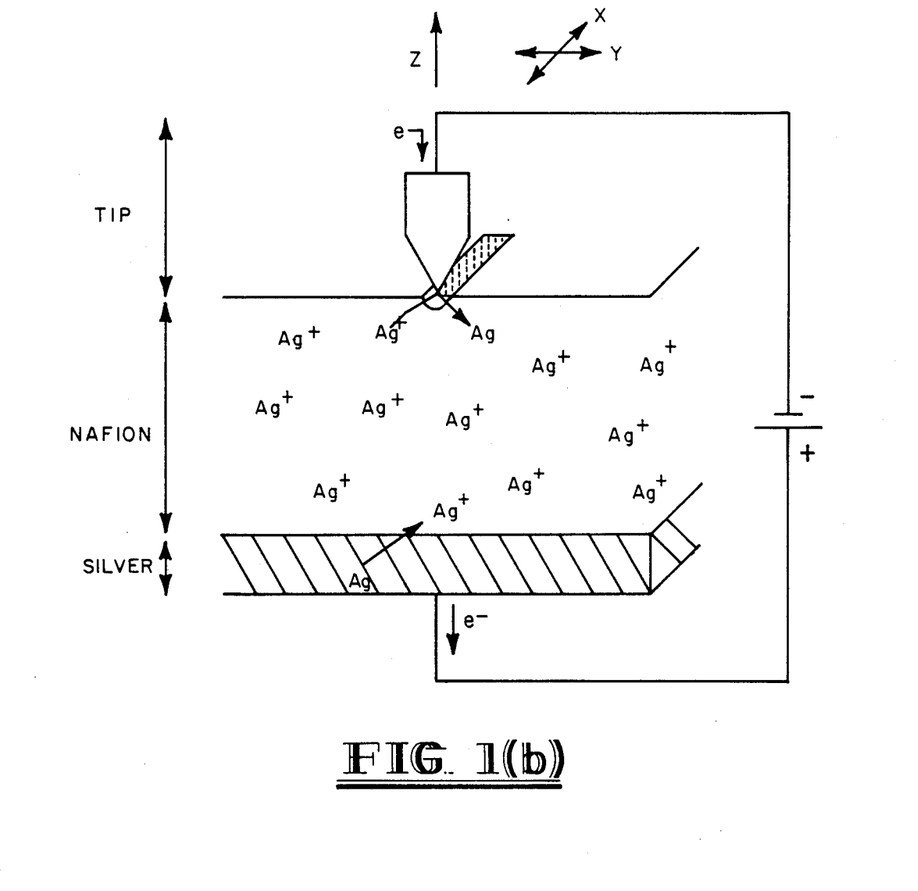
FIG. 1(b) shows the same schematic representation as FIG. 1 but replaces "metal" with silver.

The SECM apparatus used and the method of tip preparation (platinum) have been described previously (10). FIG. 1(b) shows a schematic representation of the method used to make a sample of silver deposits in Nafion films. The sample was made by first vacuum-depositing silver onto the surface of a glass slide. To obtain the lines shown in FIG. 2(b), drops of a 1% w/w solution of Nafion (E. W. 970) in ethanol were then spin coated at 3800 rpm onto the silver surface with a total of 40 drops added to give a film thickness of ca. 2.5 $\mu m$, as measured with a surface profilometer. Prior to use, the sample was first soaked in Millipore water for 1 hour and then in 50 mM silver nitrate solution for 15 minutes to incorporate the silver-containing solution into the film. The solution is then removed and the sample is dried in a gas flow (e.g., nitrogen). Experiments were performed at various bias voltages between ca. 200 mV and 8 V. Below ca. 200 mV the tip can no longer follow the surface of the Nafion and instead penetrates the film producing a scratched line. This is presumably due to either slow electrode kinetics at these voltages or resistive drop in the Nafion film. The reference current used for the SECM was approximately 15 pA. However, during the experiment the current oscillated between zero and ca. 1 nA, the exact value being dependent on the bias voltage. This current oscillation is ascribed to either vibrations of the system (estimated to be on the order of ca. 1 nm) or to an on/off mechanism for the faradaic process with no current observed before the tip touches the surface and larger currents obtained upon contact. This differs from the exponential dependence of the current as a function of the distance between the tip and substrate normally observed in scanning tunneling microscopy.

Figure 2:
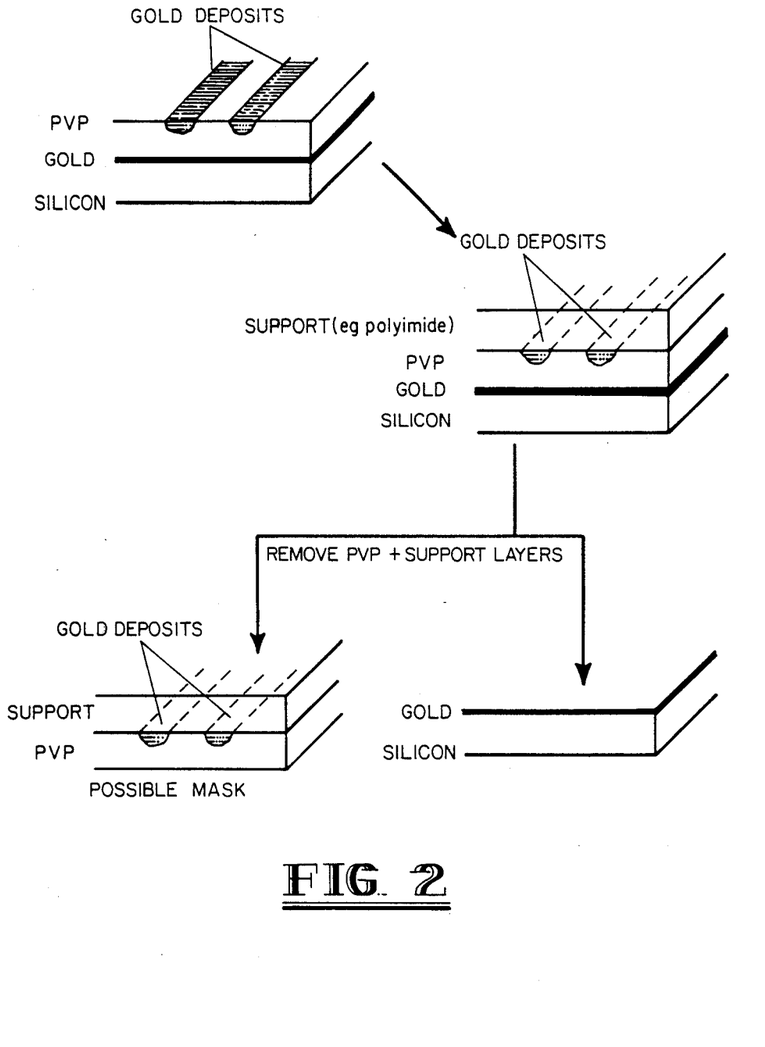
FIG. 2 schematically designates a method of mask fabrication.
Figure 2A:
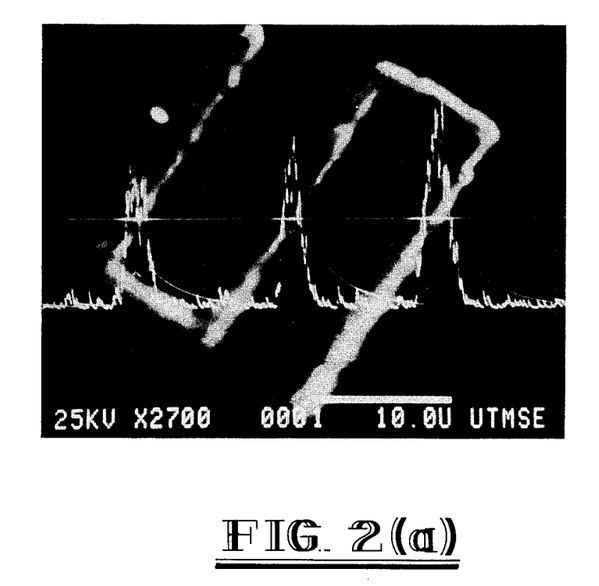
FIG. 2(a) shows a scanning electron micrograph of a pattern of copper lines deposited in a Nafion film. The bias voltage was 3 V (tip negative), with a tip scan rate of ca. 100 Å sec$^{-1}$. Marker, 10 $\mu$m. The trace represents the intensity of X-rays emitted from the sample with an energy indicative of the presence of copper, taken while scanning across the upper line. Marker, 10 $\mu$m.
Figure 2B:
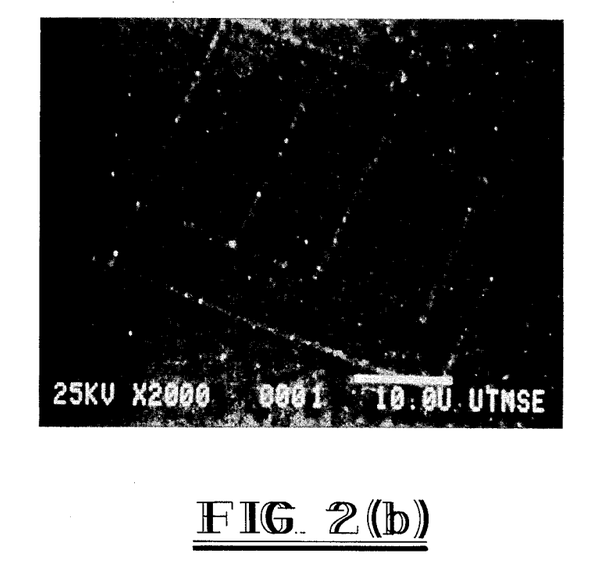
FIG. 2(b) shows a scanning electron micrograph of a pattern of silver lines deposited in a Nafion film. The bias voltage was 3 V (tip negative), with a tip scan rate of 400 Å sec$^{-1}$. Marker, 10 $\mu$m.
Figure 2C:
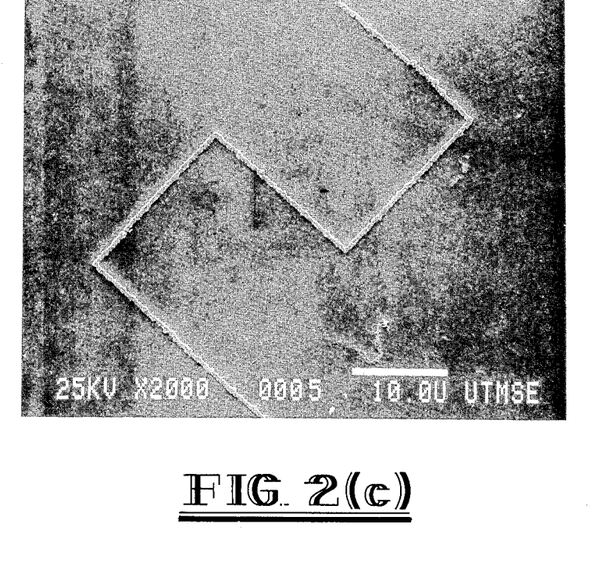
FIG. 2(c) shows a scanning electron micrograph of a pattern of silver deposits in Nafion film. The bias voltage was 5 V, and the tip scan rate was 900 Å sec$^{-1}$. Marker, 10 $\mu$m.
Figure 2D:
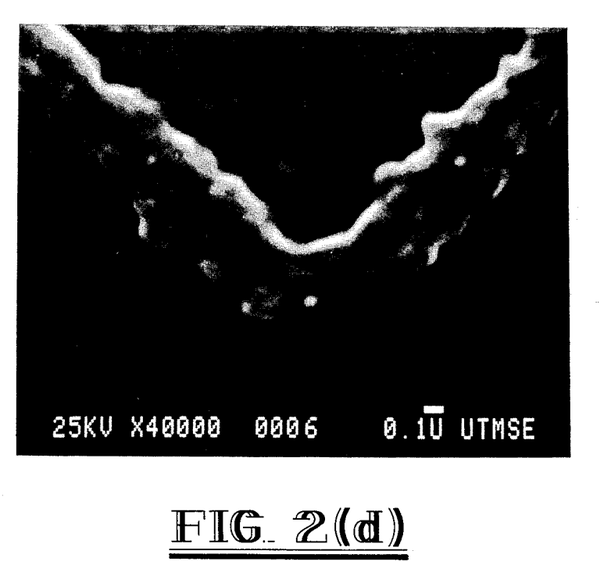
FIG. 2(d) is an enlargement of the micrograph of FIG. 2(c). Marker, 10 $\mu$m.

FIG. 2(b) shows an example of the type of structure that has been produced as observed with a scanning electron microscope. In general, the larger the applied voltage and the faster the tip is scanned over the surface, the higher the resolution that can be obtained, with lines of ca. 0.5 $\mu m$ thickness observed under optimum conditions. The scan rate usually is below ca. 1000 Å sec$^{-1}$, with dotted lines being produced at higher scan rates. However, increasing the response time of the SECM feedback control permits faster scan rates and thereby obtains even higher resolution. Indirect evidence that the lines shown are indeed silver comes from applying the same technique to other types of substrates. Lines can also be drawn with samples consisting of silver substrates coated with Nafion containing copper ions (FIG. 2(a)). Elemental analysis of these lines under the SEM shows that they contain copper. In addition, no structures are observed when platinum coated with Nafion containing only potassium counter ions was used as the sample. In this case, the current between the tip and the platinum substrate is probably maintained by the electrolysis of water at both the tip/Nafion and the platinum/Nafion interfaces. Other experiments using Nafion coated on platinum showed that several different metals can be deposited within the same polymer film. Here, a conductive substrate (Pt) was coated with Nafion, soaked with 20 mM AgNO$_3$ for about 20 minutes. After the solution was removed, lines were drawn. The Nafion film was then soaked with 20 mM $Cu(NO_3)_2$ while the substrate remained in the SECM. After 20 minutes, the copper nitrate solution was removed and copper lines were drawn.

As our publication suggests, the technique used as described above to deposit silver in Nafion films is equally effective for the deposition of metals in other ionic conductors. Further systems which use different polymer films to deposit other metals have also been used. This technique can also be used to deposit semiconductors or polymers in ionic conductive polymer films.

Figure 5:
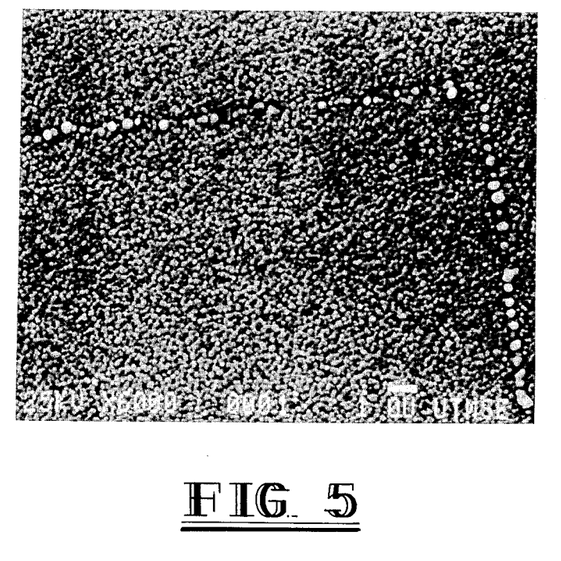
FIG. 5 shows a scanning electron micrograph of a pattern of copper deposits in gelatin film. The bias voltage was 4 V−0.5 V, and the tip scanning rate was 200 Å sec$^{-1}$. Marker, 1 $\mu$m.

One system involved a silver substrate, gelatin ionic conductor and copper (II) ions. The method of sample preparation was very similar to that described above for Nafion, and involved spin coating (3000 rpm) drops of a stock solution of gelatin onto the surface of a silver-coated microscope slide. The stock solution consisted of a mixture of 70% water and 30% ethanol containing 10% w/w gelatin and 100 mM copper (II) nitrate. Prior to spin coating, the solution was heated to ca. 70° C. to dissolve the gelatin. The tip material of the SECM tip was platinum. An SEM picture of the result obtained using this system is shown in FIG. 5. In that particular experiment the tip/substrate bias potential was initially set at 5 Volts (tip negative), though during the experiment the voltage was reduced in a series of steps down to 0.5 volts with no apparent change in the thickness of the deposited line. The tip was moved across the surface at 100 Å $sec^{-1}$.

In another system the conductive substrate was gold, the conducting film was poly-4-vinylpyridine (PVP), and the reactant was $AuCl_4^-$. Note that the mobile ion does not have to be positively charged for the technique to work.

Gold was first deposited onto the surface of a wafer of silicon to form a conductive substrate. Drops of a solution of PVP (1% w/w) in propan-2-ol containing a small quantity (0.2%) of dibromohexane were then spin coated onto the gold surface. This was then placed into an oven for 18 hours at 90° C. to allow the polymer to cross link. Prior to use, the sample was soaked in a solution containing 42 mM $AuCl_4^-$ in dilute HCl(pH=1) to incorporate the $AuCl_4^-$ ions.

Figure 4A:
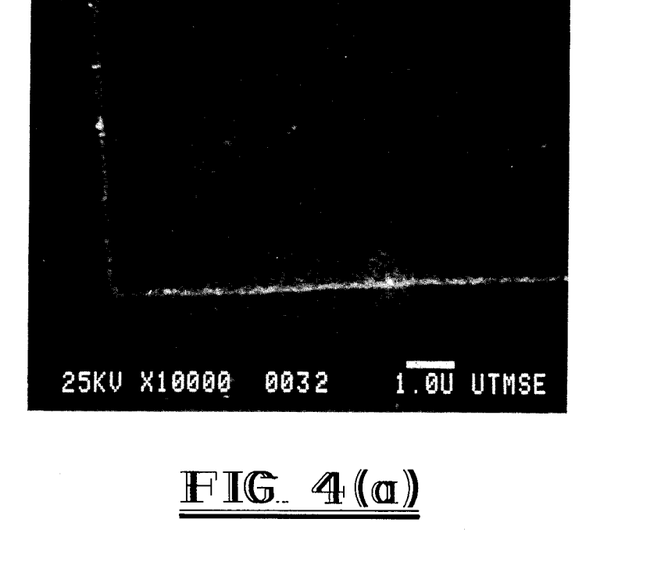
FIG. 4(a) shows a scanning electron micrograph of a gold pattern deposited in a PVP film The bias voltage was 4 V, and the tip scan rate was ca. 900 Å sec$^{-1}$. Marker, 10 $\mu$m.
Figure 4B:
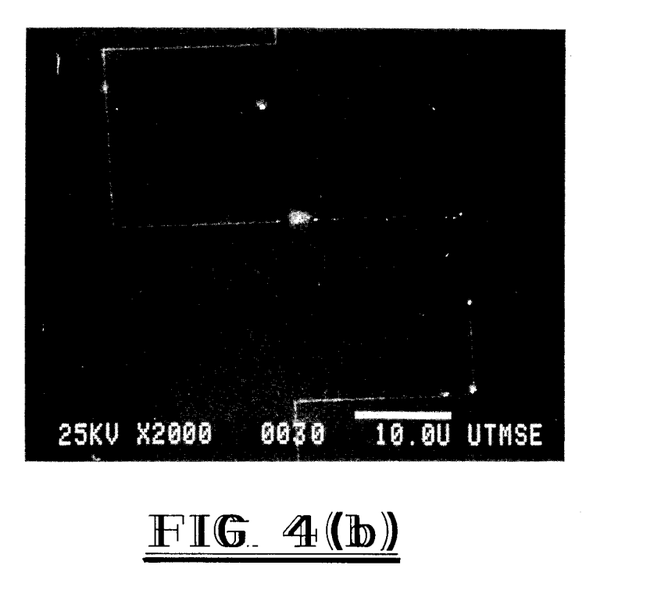
FIG. 4(b) shows the same scanning electron micrograph as in FIG. 4(a), except the magnification factor is only ×2000. Marker, 10 $\mu$m.

The tip material of the SECM tip for this experiment was tungsten. An example of the type of lines that have been obtained using this system is shown in FIG. 4(a) and 4(b). In this particular case the tip/substrate bias potential was 4 V (tip negative), with the tip being scanned over the surface of the polymer at 900 Å $sec^{-1}$.

Figure 6:
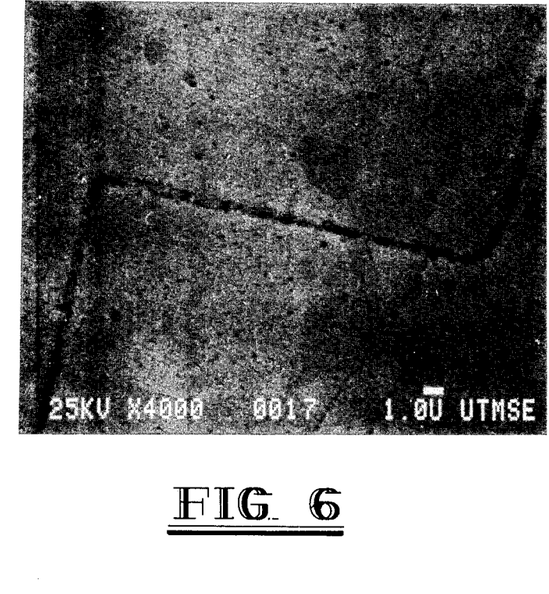
FIG. 6 shows a scanning electron micrograph of etched traces on a copper surface. The tip material was tungsten, a bias of 3 V was applied to the substrate, and the tip scan rate was ca. 1000 Å sec$^{-1}$.

As indicated in FIG. 1, passing a current through the ionic conducting polymer not only results in the electrochemical deposition of metals at the interface between the tip and the ionically conducting polymer, but also causes a localized etching of the metal substrate. To investigate this, the polymer film containing metal deposits (see above) must first be removed from the surface of the metal. For this purpose, Nafion films were dissolved with an ethanol/water mixture at 80° C., and PVP films were washed off with an alkali solution. FIG. 6 shows a scanning electron micrograph of a copper surface which has been etched using this technique. The tip material was tungsten, a bias of 3 V was applied to the substrate, and the tip scan rate was ca. 1000 Å $sec.^{-1}$. These lines were produced by moving the tip electrode over the Nafion-coated metal surface. Again, the resolution of the structures is in the submicron range. In this particular case the Nafion film contained methyl viologen (4,4′ dimethyl-4,4′-dibipyridinium) ions ($MV^{2+}$) as the species reduced at the tip. Reduction of $MV^{2+}$ occurs at the tip ($MV^{2+} + e^- \rightarrow MV^+$) to produce a soluble cationic species. Copper ions can be used in the film, but the high exchange current between ions in the film and the metal (resulting in the reaction $Cu + Cu^{2+} \leftrightarrow Cu^{2+} + Cu$) produces considerable roughening of the copper surface. A similar effect is observed when the soaking solutions used to incorporate the ions into the Nafion film are not rigorously deoxygenated. Here, the surface roughening is caused by corrosion processes resulting from the oxidation of the copper metal. The soaking process itself was performed in a nitrogen atmosphere. Better results are obtained by placing the SECM apparatus in an oxygen-free chamber. Even when the Nafion film contained methyl viologen, some copper deposition lines may be observed. These are produced by the reduction of copper ions that are released during the etching process. Etching patterns also occur during depositions of both silver in Nafion and gold in PVP.

This technique is not limited to deposition of metals. Semiconductors (such as cadmium chalcogenides) and polymers (e.g., polypyrrole, polyaniline) can also be deposited into ionic conductors. For example, CdTe of well-defined composition can be deposited cathodically from an aqueous solution of $CdSO_4$ and $TeO_2$. The type of conductivity (n- or p-type) of these semiconductors can be controlled by changing or manipulating the potential. For example, application of a potential of less than $-0.3$ V vs. saturated Calomel electrode (SCE) produces an n-type CdTe semiconductor; a potential more than $-0.3$ V vs. SCE results in a p-type semiconductor. The same procedures can be used with multilayers of polymers, whereby the top layer contains the ions to be deposited (e.g., $Cd^{2+}$ and $Te^{4+}$), and the lower layers are used to separate the undesired back reaction (i.e., oxidation of the conducting substrate). By moving the tip over the top layers, ultrasmall semiconductor structures of varying conductivity can be formed and microtransistors (Schottky barriers and p-n junctions) can be fabricated by changing the applied potential between tip and substrates. The height and width of the semiconductor deposits can be controlled by varying the tip speed and applied bias. The deposition of polymers such as polyaniline into polymer films such as Nafion can be carried out by soaking the Nafion with an acidic solution of aniline (causing exchange of the anilinium ions) followed by the usual scanning process in which oxidation of the aniline, at tip or substrate, produces fine lines of polyaniline.

Possible applications of the technique of the present invention include mask production, repair of integrated circuits and masks, and pattern deposition.

Actual and likely future advantages of embodiments of the present invention include the following six examples:

1. Deposition of semiconductors in polymer films at a SECM tip. For example, with a film containing Cd(II) and $HTeO_2^+$ reduction causes deposition of CdTe. This should be applicable to production of micro Schottky barriers, photoactive devices, electronic and optical devices.

2. Deposition of electronically conductive polymers in an ionically conducting polymer film at a SECM tip. With a film containing aniline (or pyrrole); for example oxidation would produce polyaniline (or polypyrrole).

3. Controlled polymerization or crosslinking of polymer film. The film would contain styrene and electroreduction at a SECM tip would form polystyrene. Unpolymerized portions could be readily dissolved to leave a pattern to use with a following deposition of metal or semiconductor.

4. Deposition of several metals and/or polymers in same film could be accomplished by control of tip potential.

5. Insulator deposition in film by induced pH-changes at tip, for example with $Al^{3+}$ in the film in acidic ($H^+$) form, reduction of $H^+$ at tip causes an increase in pH and precipitation of $Al_2O_3$. Similar techniques could be used to form $SnO_2$ and $Fe_2O_3$ (conductive or semiconductive). This embodiment could be useful in forming patterns for later electrodeposition or in microcapacitors.

6. Deposition of structures composed of two or more different materials might be achieved by changing the counter ion in the ionic conductor while keeping the position of the tip constant.

The technique should be useful for the production of masks which could be used for, e.g., X-ray lithography. Here the requirements are for patterns of very thin metal lines which are deep enough to absorb the incident X-rays. For this reason masks are usually made using materials which exhibit strong X-ray absorption characteristics (e.g. gold), with the lines typically being on the order of 0.5–1 μm deep. As shown earlier herein (FIGS. 4(a) and 4(b)), patterns of gold may be deposited on the surface of a thin film of PVP. These patterns could be used as a mask by simply removing the PVP film containing the gold deposit from the surface of the gold coated silicon wafer. Because the PVP film is so thin (less than 1 μm) it exhibits poor mechanical stability. For this reason it will probably be necessary to deposit a thicker layer of X-ray translucent support material (e.g. polyimide) onto the surface of the PVP film prior to separating the film from the conductive substrate (FIG. 2).

Following the procedures illustrated in FIG. 2, a test mask has been produced by depositing silver lines in Nafion, as described above. After the experiment, a few drops of a 1-methyl-2-pyrrolidinone solution containing 5% w/w of polyimide were put on the top of the Nafion and its lines. After drying the sample at 55° C. for three hours, the polyimide film was glued on glass using a two-component epoxy. After hardening, the polyimide, supported by the glass, was removed from the original conducting substrate. SEM clearly showed the lines on the polyimide and an EDS analysis detected silver only in the lines and nowhere else.

Figure 3:
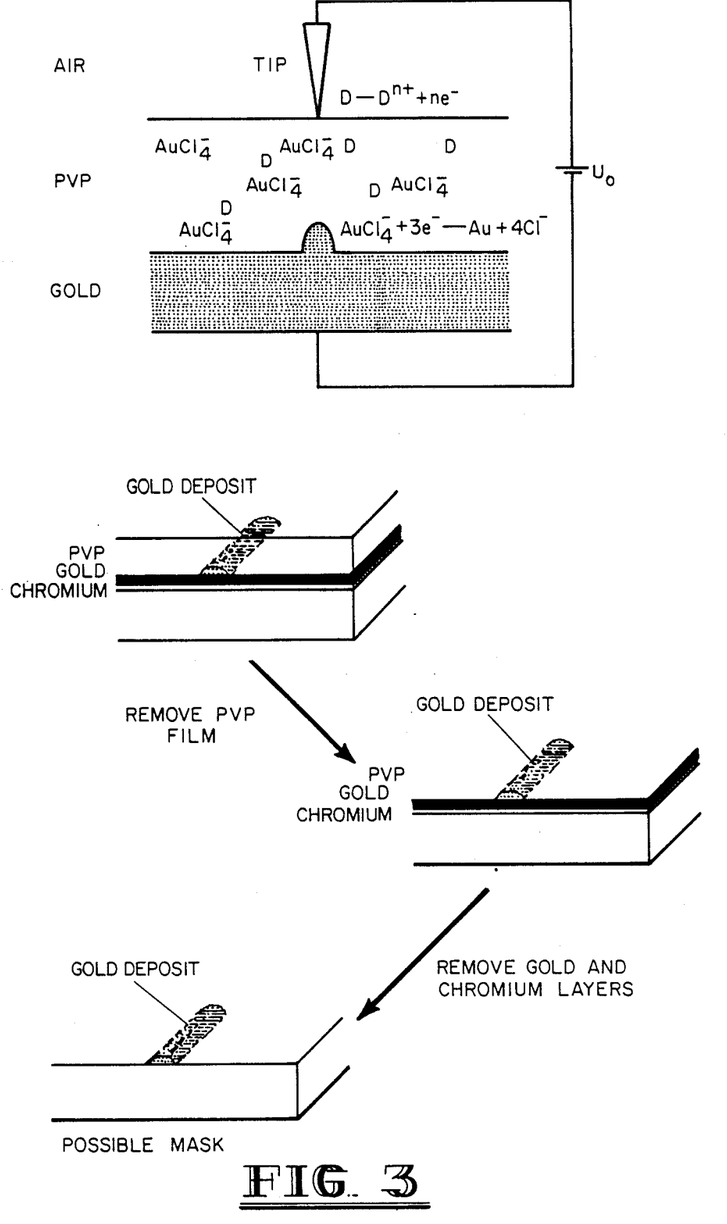
FIG. 3 schematically designates an alternative method of mask fabrication.

Another possible method for mask production involves using the same type of PVP sample as before with the only difference being the polarity of the bias potential applied between the tip and the conductive substrate which is now the reverse of that used previously (i.e. tip now positive). The consequence of this change in polarity is that gold is now deposited at the interface between the conductive substrate and the conducting film (FIG. 3) as opposed to the previously described metal depositions which occurred at the tip/conducting film interface. The field across the ionically conducting polymer film will favor the deposition of gold on the area of the sample directly underneath the tip, and hence structures of very thin linewidth (submicron) should again be attainable. To make masks in this way would require dissolving away the PVP and then removing the thin overlaying layer of gold from the surface of the underlaying silicon layer of the substrate.

Figure 7:
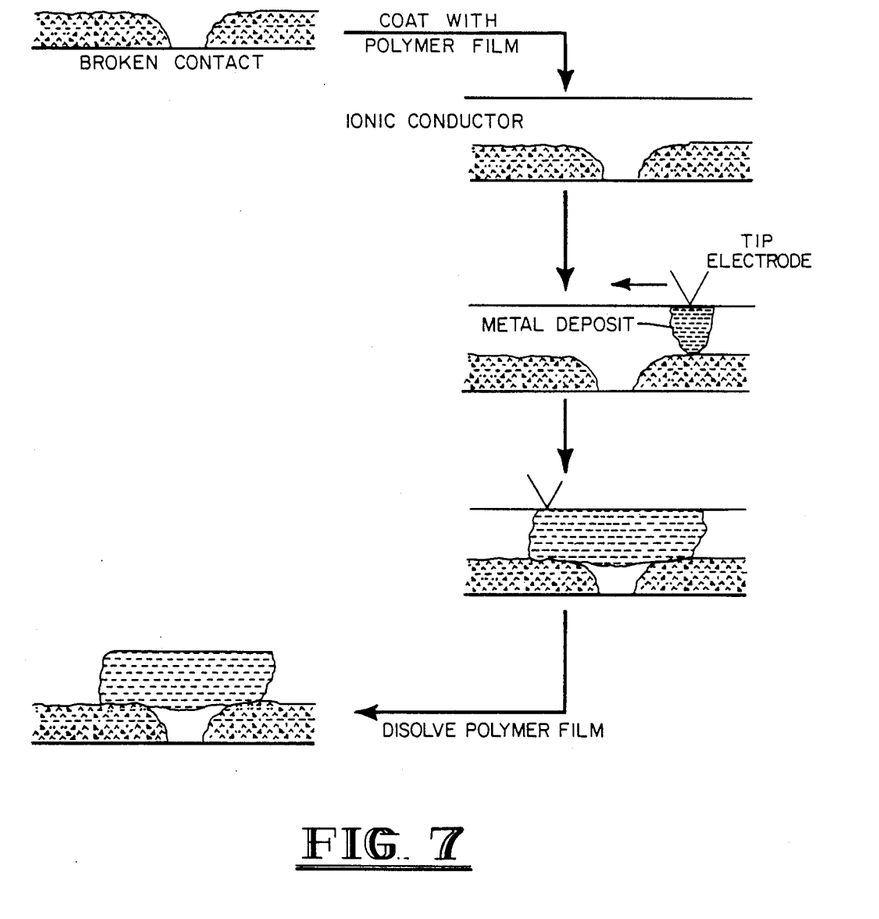
FIG. 7 schematically designates a method of depositing metal over a broken contact.

Another possible use of the present invention is for the repair of various conductive objects such as broken contacts in integrated circuits or mask defects. An example of how this might be achieved is shown schematically in FIG. 7, and involves coating the conductive object with a thin layer of an ionic conductor containing metal ions. An SECM tip would then be scanned over the surface of the ionic conductor directly above the region of intended deposition, such as the damaged region of contact. This would result in the deposition of a metal line that bridges the broken gap in the contact. Finally the ionic conductor would be removed to leave the repaired circuit.

At present the patterns produced using this technique are composed of lines that are "drawn" individually by scanning the tip over the surface of the ionic conductor. This may make the process too slow to be used for the large scale production of whole integrated circuits This problem might be alleviated by using a tip electrode which already contains the desired pattern. One method that can be visualized for making tips of this nature would be as follows:

(i) Use the normal technique to produce a pattern of silver lines in a Nafion film.
(ii) Remove the Nafion film from the surface of the silver coated microscope slide.
(iii) Attach the region of the Nafion film that contains the silver pattern to the end of a Pt tip electrode in such a way that the silver lines are all in electrical contact with the Pt.

Tips made in this way could be used to reproduce the same pattern of deposited lines in other films of ionically conducting polymers. To achieve this would require the use of samples as before (e.g. Nafion containing silver ions on a silver substrate). Again a bias voltage would be applied between the tip and the sample. The two electrodes would then be brought together in such a way that all areas of the pattern on the tip make contact with the surface of the ionic conductor simultaneously. The tip position would then be held stationary for a short period by maintaining a constant current between the tip and the sample. The result of this will be the deposition of metal in the ionic conductor with an identical pattern being produced as was present on the tip electrode. Use of this method would allow the same pattern to be reproduced repeatedly on time scales having the order of seconds.

The major problem envisualized for this procedure using a "patterned" tip is to align the tip and sample in such a way that all regions of the pattern on the tip touch the sample at the same time. With regard to this problem it might be easier instead of using a tip containing the entire pattern to use a system of multiple tips each of which can be controlled by a separate feedback control. Multiple tip systems could potentially be used in various ways.

A series of tips can be brought in contact with the surface of the ionic conductor and the sample then moved to produce the desired pattern. In this way using x tips the same pattern will be reproduced on the surface of a wafer x times (has the effect of speeding the process up by a factor of x).

It might also be possible to use a large number of tips each of which can be controlled separately so as to allow them to be either in contact with, or removed from, the surface as required. By moving the sample for short distances and using the different tips as required as relatively complicated pattern of lines could be produced in a short space of time.

The references in the following list are incorporated by reference herein for the reasons cited.

REFERENCES

1. G. Binnig and H. Rohrer, Helv Phys. Acta, 55, 726 (1982).
2. G. Binnig, H. Rohrer, Ch. Gerber, E. Weibel, Phys. Rev. Lett., 50, 120 (1983).
3. M. Ringger, H. R. Hidber, R. Schlogl, P. Oelhafen, H.-J. Guntherodt, Appl. Phys. Lett., 46, 832 (1985).
4. M. A. McCord and R. F. W. Pease, J. Vac. Sci. Technol. B, 5, 430 (1987).
5. R. M. Silver, E. E. Ehrichs, A. L. deLozanne, Appl. Phys. Lett., 51, 247 (1987).
6. D. W. Abrahams, H. J. Mamin, E. Ganz, J. Clarke, IBM J. Res. Devel., 30, 492 (1986).
7. M. A. McCord and R. F. W. Pease, Appl. Phys. Lett., 50, 569 (1987).
8. U. Staufer, R. Wiesendanger, L. Eng, L. Rosenthaler, H. R. Hidber, H.-J. Guntherodt, N. Garcia, Appl. Phys. Lett., 51, 244 (1987).
9. C. W. Lin, F.-R. F. Fan, A. J. Bard, J. Electrochem. Soc., 134, 1038 (1987).
10. H.-Y. Liu, F.-R. F. Fan, C. W. Lin, A. J. Bard, J. Am. Chem. Soc., 108, 3839 (1986).
11. Nafion is a registered trademark of E. I. duPont de Nemours and Co., Inc.

What is claimed is:

1. A method for producing a pattern of sub-micron-size deposit features, comprising the steps of:
    forming a conducting film on a conductive substrate to make a film-covered substrate having an outer film surface, said film containing a reactant that will, in an electrochemical reaction, deposit a desired product;
    placing a very fine scanning electrochemical microscope (SECM) tip in contact with the outer film surface;
    passing a faradaic current between the SECM tip and the conductive substrate and through the conducting film to induce an electrochemical reaction that will cause the desired product to be deposited in the conducting film; and
    moving the SECH tip across the surface of the conducting film to form a pattern of sub-micron-sized deposit features.

2. A method for producing X-ray lithography masks comprising the steps of:
    forming a conducting film on a conductive substrate to form a film-covered substrate having an outer film surface, said film containing a reactant that will deposit metal upon electrochemical reaction;
    placing a very fine scanning electrochemical microscope (SECM) tip in contact with the conducting film;
    applying a bias voltage between the SECM tip and the conductive substrate with the tip being negative so that the SECM tip can track the outer film surface via standard feedback control;
    passing a faradaic current between the SECM tip and the conductive substrate and through the conducting film to induce an electrochemical reaction which will deposit metal at the outer film surface;
    moving the tip of the SECM across the outer film surface in a predetermined pattern with the height of the SECM tip maintaining constant contact with the conducting film via standard feedback control, said movement, in combination with the electrochemical reaction, leaving a metal deposit pattern at the outer film surface of the conducting film;
    depositing a layer of a substantially X-ray translucent support material over the outer film surface of the conducting film; and
    separating the conducting film and support layer from the conductive substrate, said separated film with metal deposit pattern and support layer being usable as an X-ray lithograph mask.

3. A method for producing X-ray lithography masks, comprising the steps of:
    forming a conductive substrate which has a metallic overlayer and a conductive underlaying material, said underlaying material having minimal X-ray absorption characteristics;
    forming a conducting film on the conductive substrate to form a film-covered substrate having an interface surface between the film and substrate and an outer film surface, said film containing a reactant that deposits a particular product upon electrochemical reaction;
    placing a very fine scanning electrochemical microscope (SECM) tip in contact with the conducting film;
    applying a bias voltage between the SECM tip and the conductive substrate with the tip positive so that the tip of the SECM can track the outer film surface via standard feedback control;
    passing a faradaic current between the SECM tip and the conductive substrate and through the conducting film to induce an electrochemical reaction which will deposit the particular product at the interface directly beneath the SECM tip;
    moving the SECM tip across the outer film surface in a predetermined pattern with the height of the SECM tip maintaining constant contact with the conducting film via standard feedback control, said movement, in combination with the electrochemical reaction, leaving a pattern of product deposits at the interface between the conducting film and the conductive substrate;
    removing the conducting film to leave a pattern of product deposits on the conductive substrate; and
    removing the metallic overlayer from the conductive substrate to leave the pattern of product deposits on the conductive underlayer, said pattern and conductive underlayer being usable as an X-ray lithograph mask.

4. A method for high resolution deposition of metal on a conductive object comprising the steps of:
    coating the conductive object with a layer of an ionic conductor containing metal ions;
    placing a very fine scanning electrochemical microscope (SECM) tip in contact with the ionic conductor;
    applying a bias voltage between the SECM tip and the conductive object so that a faradaic current passes between the SECM tip and the conductive object and through the ionic conductor to reduce the metal ions out of the ionic conductor and deposit the ions on the conductive object;
    scanning the SECM tip over the ionic conductor directly above a region of intended deposition to leave a high resolution deposition of metal on the conductive object; and removing the ionic conductor to leave behind a high resolution deposition of metal on the conductive object.

5. The method for producing X-ray lithography masks of claim 2 or 3 in which the height of the SECM tip as it passes across the outer film surface is controlled by standard feedback control so that the STM tip maintains a uniform penetration into the conducting film.

6. The method for producing sub-micron-size deposit features of claim 1 in which the conducting film contains a reactant that will deposit metal upon electrochemical reaction.

7. The method for producing sub-micron-size deposit features of claim 1 in which conducting film contains a reactant that will deposit a semiconductor upon electrochemical reaction.

8. The method for producing sub-micron-size deposit features of claim 1 in which conducting film contains a reactant that will deposit a polymer upon electrochemical reaction.

9. The method for high resolution deposition of claim 4 in which, instead of depositing a metal, a semiconductor is deposited by coating a conductive object with a layer of ionic conductor containing semiconductor ions so that the steps of applying a bias voltage, scanning the SECM tip over the ionic conductor, and removing the ionic conductor combine to deposit a high resolution deposition of the semiconductor on the conductive object.

10. The method for high resolution deposition of claim 4 in which, instead of depositing a metal, a polymer is deposited by coating a conductive object with a layer of ionic conductor containing polymeric ions so that the steps of applying a bias voltage, scanning the SECM tip over the ionic conductor, and removing the ionic conductor combine to deposit a high resolution deposition of the polymer on the conductive object.

11. The method for high resolution deposition of semiconductors of claim 9 further comprising the step of controlling the type of conductivity of the semiconductor that is deposited on the conductive object by manipulation of the bias voltage that is applied between the SECM tip and the conductive substrate such that the bias voltage magnitude and polarity will produce either an n-type or p-type deposited semiconductor.

12. The method for high resolution deposition of semiconductors of claim 11 in which the manipulation of the bias voltage combines with the scanning of the SECH tip to form semiconductor structures of varying conductivity, microtransistors and Schottky diodes.

13. The method for high resolution deposition of semiconductors of claim 12 in which the height and width of the semiconductor deposition is controlled by varying the applied bias voltage and SECM tip movement speed.

14. A method for producing sub-micron-size deposit features of claim 1 in which several different materials can be deposited within the same conducting film, comprising the additional steps of:
soaking the conducting film, in which a pattern of sub-micron-sized deposit features has previously been deposited by the method of the present invention, in a new solution containing an additional material to be deposited in the film;
removing the soaking solution;
placing a very fine scanning electrochemical microscope (SECM) tip in contact with the outer film surface;
passing a faradaic current between the SECM tip and the conductive substrate and through the conducting film to include an electrochemical reaction that will cause the additional material to be deposited in the conducting film; and
moving the SECM tip across the surface of the conducting film to form a pattern of sub-micron-sized deposit features of the additional material.

15. The method for high resolution deposition of metal of claim 4 in which the metal is gold.

16. The method for high resolution deposition of metal of claim 15 in which the bias voltage is applied so that metal is deposited in the ionic conductor and adjacent the SECM tip.

17. The method for producing a pattern of sub-micron-sized deposit features of claim 1 in which the conducting film is Nafion, and the desired product to be deposited is silver.

18. A method to repair a mask defect or a defective contact in an integrated circuit, the method involving high resolution deposition of metal on a defective region of the circuit or mask, and comprising the steps of:
coating the circuit or mask with a layer of an ionic conductor containing metal ions;
placing a very fine scanning electrochemical microscope (SECM) tip in contact with the ionic conductor;
applying a bias voltage between the SECM tip and the conductive object so that a faradaic current passes between the SECM tip and the circuit or mask and through the ionic conductor to reduce the metal ions out of the ionic conductor and deposit the ions on the conductive circuit or mask;
scanning the SECM tip over the ionic conductor directly above the defective region of the circuit or mask to leave a high resolution deposition of metal on the circuit or mask; and
removing the ionic conductor to leave behind a circuit or mask repaired by a high resolution deposition of metal on the defective region thereof.

* * * * *